(12) United States Patent
Raben

(10) Patent No.: US 8,035,208 B2
(45) Date of Patent: Oct. 11, 2011

(54) INTEGRATED CIRCUIT PACKAGE

(75) Inventor: Jurgen Leonardus Theodorus Maria Raben, Terborg (NL)

(73) Assignee: Sencio B.V., Nijmegen (NL)

( * ) Notice: Subject to any disclaimer, the term of this patent is extended or adjusted under 35 U.S.C. 154(b) by 148 days.

(21) Appl. No.: 12/254,543

(22) Filed: Oct. 20, 2008

(65) Prior Publication Data
US 2009/0102033 A1    Apr. 23, 2009

(30) Foreign Application Priority Data
Oct. 18, 2007  (EP) .................................. 07118767

(51) Int. Cl.
*H01L 21/44* (2006.01)

(52) U.S. Cl. ........ 257/680; 257/666; 257/687; 257/787; 257/E23.141; 257/E33.066; 257/E23.031; 257/E23.06

(58) Field of Classification Search .................. 257/666, 257/680, 687, 787, E23.141, E33.066, E23.031, 257/E23.06
See application file for complete search history.

(56) References Cited

U.S. PATENT DOCUMENTS

| | | | |
|---|---|---|---|
| 6,260,417 B1 * | 7/2001 | Watanabe et al. | 73/754 |
| 7,504,666 B2 * | 3/2009 | Vittu | 257/98 |
| 2005/0280017 A1 * | 12/2005 | Oshio et al. | 257/99 |
| 2006/0055500 A1 * | 3/2006 | Burke et al. | 338/22 R |
| 2008/0048204 A1 * | 2/2008 | Ishikura et al. | 257/99 |
| 2008/0096321 A1 * | 4/2008 | Lin et al. | 438/113 |
| 2009/0230487 A1 * | 9/2009 | Saitoh et al. | 257/419 |

* cited by examiner

*Primary Examiner* — Michelle Estrada
(74) *Attorney, Agent, or Firm* — Young & Thompson

(57) ABSTRACT

Package for an integrated circuit (IC), includes a housing (3) of a first material having two major surfaces (4, 5). The major surfaces are substantially parallel to each other. Furthermore, a lead frame (6) is present for carrying the IC (2), the lead frame (6) including contact terminals (7) for electrical communication with the IC (2). The package (1) has a through-hole (8) in the two major surfaces (4, 5), allowing various special applications of the package (1).

19 Claims, 3 Drawing Sheets

INTEGRATED CIRCUIT PACKAGE

FIELD OF INVENTION

The present invention relates to a package for an integrated circuit (IC), said package comprising;
- a housing of a first material, having two major surfaces, which are substantially parallel to each other,
- a lead frame for carrying the IC, the lead frame comprising outside contact terminals for electrical communication with the IC.

BACKGROUND

Such a package is known from e.g. PCT patent application WO2004/086003 wherein a method and assembly are shown, the method including the steps of providing a coated or uncoated sensor element having an exposed sensing surface; attaching the sensor element to a platform so that the exposed sensing surface is spaced from the platform; and optionally applying a protective layer over the platform while maintaining the sensing surface as exposed. The assembly includes a resonator having a free portion with a sensing surface incorporated onto a platform, components of the sensor are physically shielded from harsh operating conditions, the requisite space is maintained between the free portion of the resonator and the platform, and the sensing surface of the resonator remains exposed for sensing. The assembly may include a cut-out through which the sensor is exposed to ambient environment. This known package offers a very limited design freedom and a limited possible interaction between sensor and media to be sensed.

SUMMARY OF THE INVENTION

The invention aims to provide an improved package with a predetermined shape and well defined dimensions.

According to a first aspect of the invention a package for an integrated circuit (IC) is provided, said package comprising;
- a housing of a first material, having two major surfaces, which are substantially parallel to each other,
- a lead frame for carrying the IC, the lead frame comprising outside contact terminals for electrical communication with the IC,
- wherein the package comprises a through-hole in the two major surfaces. This hole can have any shape like round, rectangular, square, oval etc. The material of the housing can be a resin which is UV or temperature cured for hardening.

This provides a design freedom to enable access through the package, possibly in combination with a hole in the substrate and/or printed circuit board. This package may be used to enable a sensor surface of an electronic component to communicate with a fluid.

In an embodiment of the package according to the invention, the longitudinal axis of said through-hole is substantially perpendicular to said major surfaces. This simplifies the manufacturing process of the package and allows maximum possible access to the through-hole.

In an embodiment of the package according to the invention, the package further comprises an electronic component in said through-hole which is e.g. mechanically attached to an outline of said through-hole. This electronic component can be an ASIC, a sensor etc. that extends into the through-hole space.

In an embodiment of the package according to the invention, the electronic component comprises a sensor surface, possibly in the through hole, enabling a fluid access to a sensing surface of said sensor to measure various parameters of the fluid, like pressure, viscosity etc. The sensor surface is e.g. shaped as a tuning fork, as used in piezo flow sensors.

In an embodiment of the package according to the invention, a first portion of said electronic component is encapsulated by said housing. This protects the portion of the electronic component against possibly aggressive fluids and improves the robustness of the system.

In an embodiment of the package according to the invention, said electronic component comprises electrical contact members, like outside contact terminals for electrical contact with the IC. When provided on said first portion of the electronic component, these contacts are protected by the housing.

In an embodiment of the package according to the invention, the package further comprises a ring member having an opening possibly congruent with the through-hole. This gives a designer a freedom with to respect to e.g. material choice, dimensions etc. in the interface area of the electronic component and the fluid. The ring member may be premoulded or manufactured otherwise.

In an embodiment of the package according to the invention, said ring member is of a second material. This can be a thermoplastic material, though it can be duroplast as well.

In an embodiment of the package according to the invention, said first material and said second material are different.

In an embodiment of the package according to the invention, said ring member is a carrier for carrying said electronic component. The ring member and the electronic component may be affixed and handled a sub-assembly.

The invention further relates to an assembly of a package according to any one of the preceding claim and a carrier element, in which the carrier element comprises a second through-hole coaxial with said through-hole in the package.

The invention further relates to a method of packaging an electronic component, the method comprising;
- mechanically affixing said electronic component and a ring member,
- electronically connecting electrical contact members provided on said electronic component,
- encapsulate a first portion of said ring member, said portion carrying said electrical contact members of electronic component. Applying of this method offers the advantage of a package wherein contact members are protected by the encapsulation.

In an embodiment of the method according to the invention, the method further comprises;
- moulding of said ring member. This results in a ring member with a well defined shape en dimensions and consequently a good basis for a proper positioning of the electronic component.

The various aspects discussed in this patent can be combined in order to provide additional advantageous advantages.

DESCRIPTION OF THE DRAWINGS

The invention will be further elucidated referring to an preferred embodiment shown in the drawing wherein shown in:

FIG. 4b a side view of a cross section of the package according to FIG. 4a;

FIG. 5a top view of a package with an electronic component in the hole;

FIG. 5b a side view of a cross section of the package according to FIG. 5a;

DETAILED DESCRIPTION OF EMBODIMENTS

Figure 1:
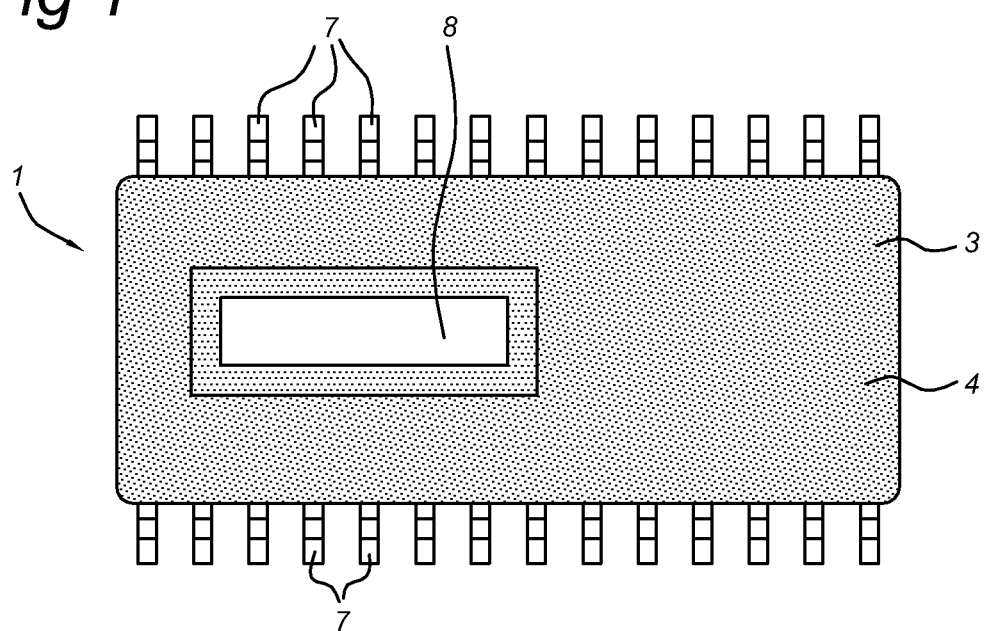
FIG. 1 in top view a package according to the invention.
Figure 2:
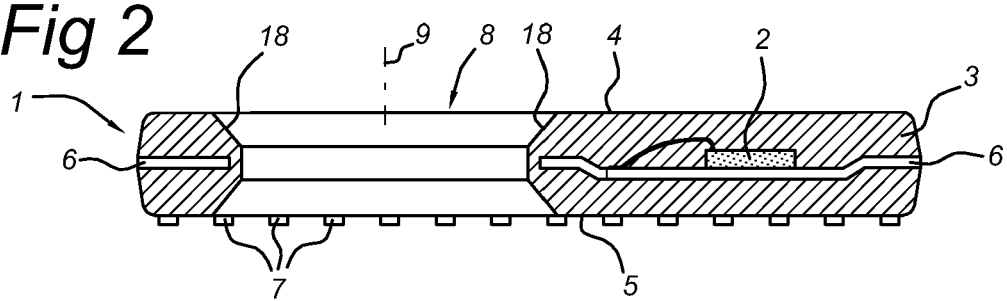
FIG. 2 a side view of a cross section of the package according to FIG. 1.
Figure 3:
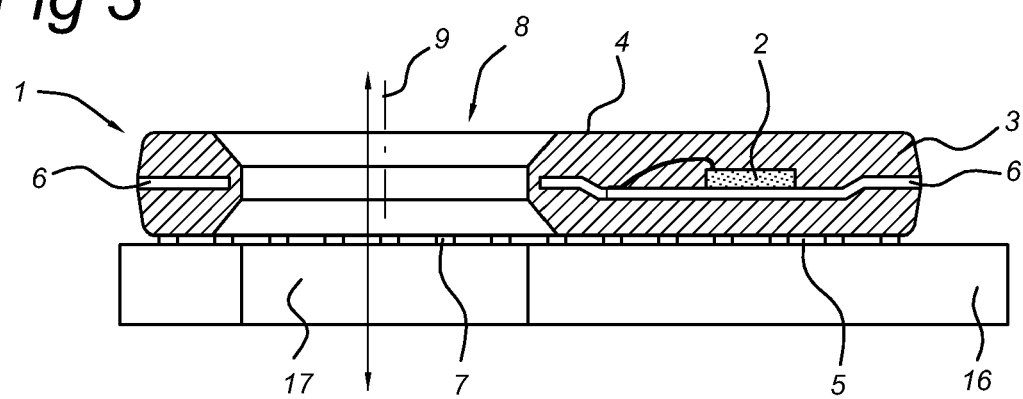
FIG. 3 a side view of a cross section of the package according to FIG. 1 assembled on a printed circuit board.

In FIG. 1 and FIG. 2 a first embodiment of the package 1 according to the invention is shown. FIG. 3 shows a first embodiment with a package 1 assembled on a carrier element 16, such as a printed circuit board 16. The package 1 for protecting an IC 2 comprises a housing 3 having two major surfaces 4, 5 which are substantially plan parallel to each other. The housing 3 contains a lead frame 6. This lead frame 6 carries the IC 2 and any other desired component. Contact pads of the IC 2 are electrically connected to the lead frame 6 by e.g. wire-bonding. Outside contact terminals 7 are electrically connected via the lead frame 6 with the IC 2. Extremities of contact terminals 7 all lie in a plane substantially parallel to the major surfaces 4, 5. In the embodiment shown in FIGS. 1-3 the package 1 is provided with a through-hole 8 with a rectangular shape. Other shapes are possible for the through-hole 8 like a circle, oval square etc. The longitudinal axis 9 of the through-hole 8 is substantially perpendicular to the major surfaces 4, 5 of the package 1. The outline of the through-hole 8 is bevelled or inclined with respect to the major surfaces 4, 5 so that a chamfer 18 is provided. This chamfer 18 simplifies fitting e.g. a tube in the through-hole 8. In FIG. 3 package 1 is mounted on a printed circuit board 16. This printed circuit board 16 is provide with a through-hole 17. In this embodiment the through-hole 8 and the through-hole 17 are coaxial, though other arrangements are possible as well. This first embodiment offers design freedom by providing access through the package and possibly through the printed circuit board as well. One may lead a fluid through the hole, move a body through the hole or lead conductors like a wire or a flat cable through the hole.

Figure 4A:
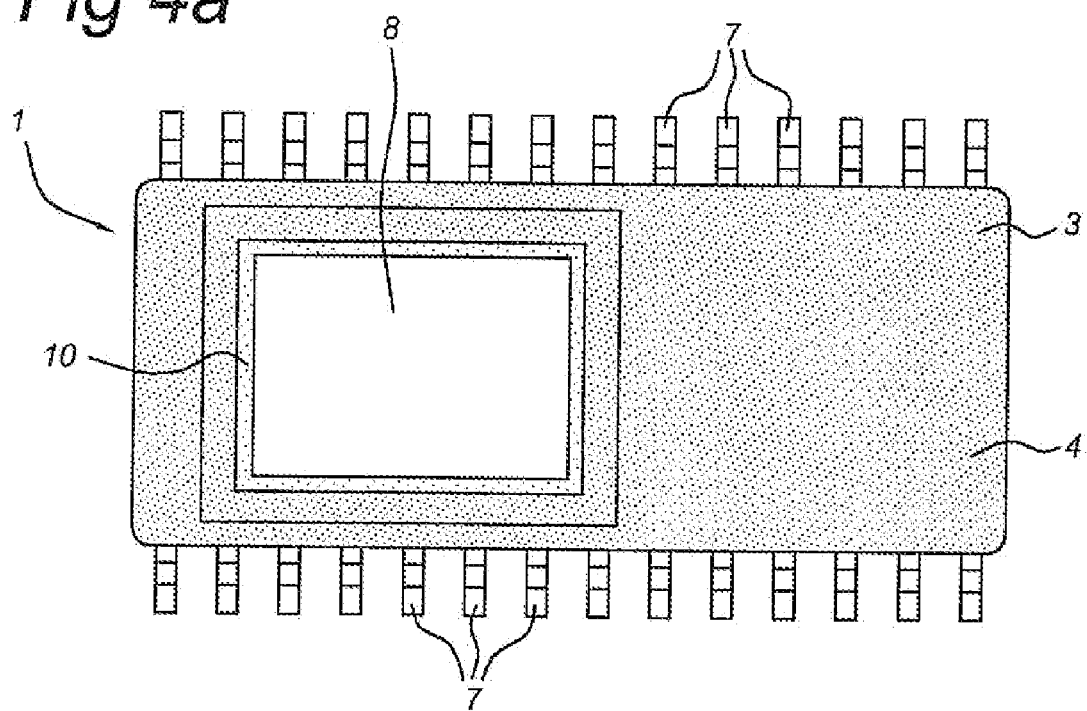
FIG. 4a in top view a package and a ring member.
Figure 4B:
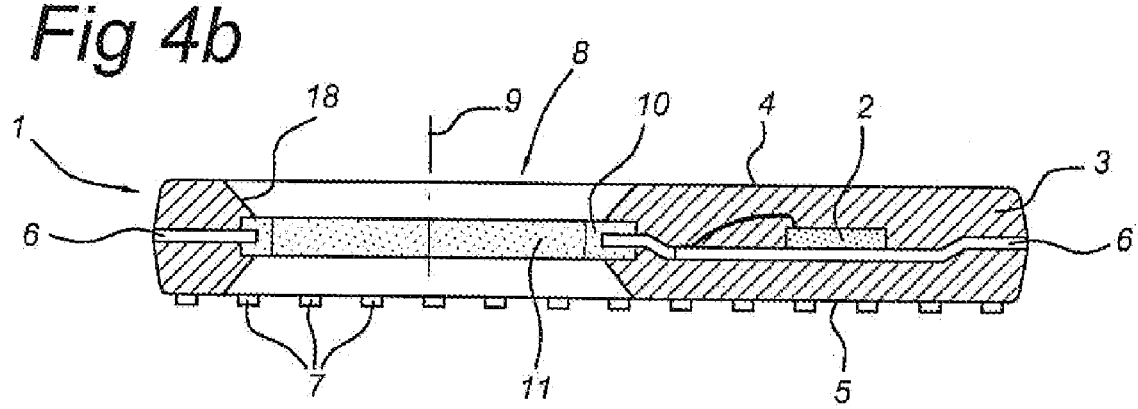

In FIGS. 4a and 4b a second embodiment of the package according to the invention is shown. The package 1 for protecting an IC 2 comprises a housing 3 having two major surfaces 4, 5 which are substantially plan parallel to each other. The housing 3 contains a lead frame 6. This lead frame 6 carries the IC 2 and any other desired component. Contact pads of the IC 2 are electrically connected to the lead frame 6 by e.g. wire-bonding. Outside contact terminals 7 are electrically connected via the lead frame 6 with the IC 2. Extremities of contact terminals 7 all lie in a plane substantially parallel to the major surfaces 4, 5. The package 1 is provided with a through-hole 8 with a rectangular shape. Other shapes are possible for the through-hole like a circle, oval square etc. At the outline of the through-hole 8, a chamfer 18 is provided. This chamfer 18 simplifies fitting e.g. a tube in the through-hole 8. The package 1 is further provided with a ring member 10 arranged in through-hole 8. The shape of this ring member 10 or insert 10 is congruent with the shape of the through-hole 8. The ring-member 10 itself is provided with a through-hole 11 as well. In this embodiment the shape of through-hole 11 is congruent with the shape of through-hole 8 in the package 1, though other shapes are possible as well. In FIG. 4b it is shown that ring member 10 extends into housing 3 and is firmly held by housing 3. This can be achieved by e.g. pre-moulding the ring member 10, insert this member in the package tooling and encapsulate the ring member 10 in the housing 3. The housing 3 comprises a first material like e.g. a duroplast while the ring member 10 comprises a second material. The second material may be a softer material than the first material so that the ring member 10 is clamped by the housing 3. In this embodiment the lead frame 6 extends into the ring member 10. Using a ring member 10 offers even more design freedom with respect to material choice and shape. The ring member 10 may be adapted for a certain application and provide a connection like for instance a snap joint. The material choice of the ring member 10 may be tailored to a certain fluid.

Figure 5A:
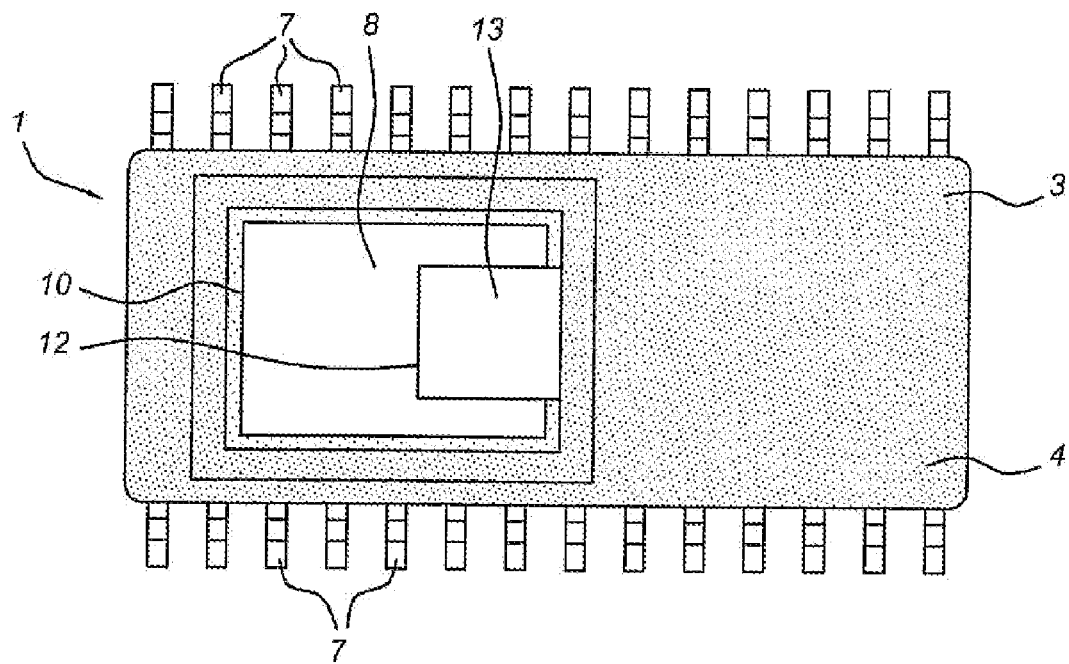
Figure 5B:
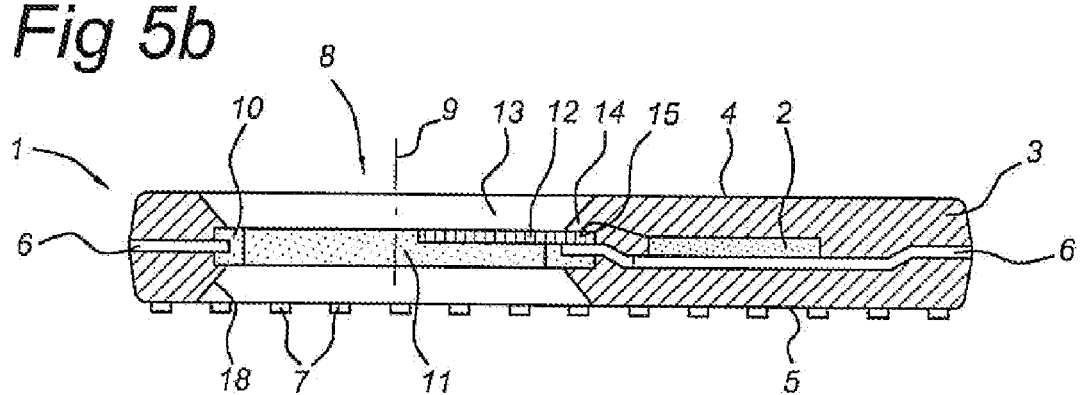
Figure 6:
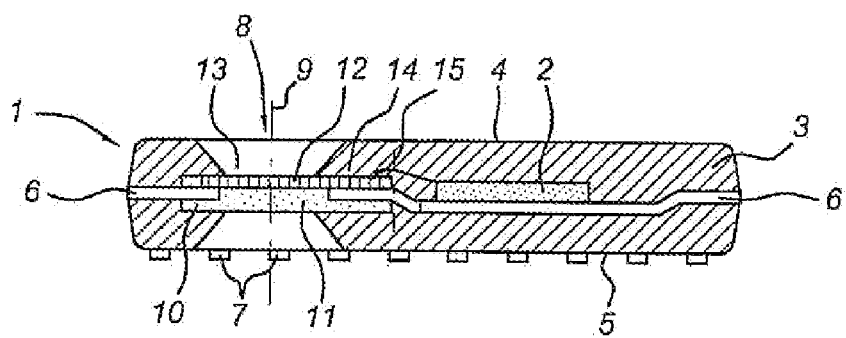
FIG. 6 a side view of a cross section of a package with a sensor extending over all through-hole.

FIG. 5a-5b and FIG. 6 show a third embodiment of the package according to the invention. The package 1 for protecting an IC 2 comprises a housing 3 having two major surfaces 4, 5 which are substantially plan parallel to each other. The housing 3 contains a lead frame 6. This lead frame 6 carries the IC 2 and any other desired component. Contact pads of the IC 2 are electrically connected to the lead frame 6 by e.g. wire-bonding. Outside contact terminals 7 are electrically connected via the lead frame 6 with the IC 2. Extremities of contact terminals 7 all lie in a plane substantially parallel to the major surfaces 4, 5. The package 1 is provided with a through-hole 8 with a rectangular shape. Other shapes are possible for the through-hole like a circle, oval square etc. At the outline of the through-hole 8, a chamfer 18 is provided. This chamfer 18 simplifies fitting e.g. a tube in the through-hole 8. The package 1 is further provided with a ring member 10 arranged in through-hole 8. The shape of this thin-walled ring member 10 or insert is congruent with the shape of the through-hole 8. The ring-member 10 itself is provided with a through-hole 11 as well. In this embodiment the shape of through-hole 11 is congruent with the shape of through-hole 8 in the package 1, though other shapes are possible as well. In FIG. 4b it is shown that ring member 10 extends into housing 3 and is firmly held by housing 3. This can be achieved by e.g. pre-moulding the ring member 10, insert this member in the package tooling and encapsulate the ring member 10 with e.g. a duroplast material.

In this embodiment the lead frame 6 extends into the ring member 10. In the through-hole 8 there is provided an electronic component 12 like e.g. a sensor with a sensor surface 13. When this sensor surface 13 is in fluid connection with a fluid, parameters like pressure, viscosity, conductivity, type of material, concentration etc. can be measured and IC 2 can process the sensor signal. The electronic component 12 is attached to or held in position by ring member 10, housing 3 as well as lead frame 6. Electrical contact members 15 or contact pads 15 of electronic component 12 are provided on a first portion 14 of the electronic component 12. This first portion 14 is encapsulated in the housing 3 so that the contact pads 15 are protected against exposure to e.g. aggressive fluids. The contact pads 15 are electrically connected tot the IC 2 using e.g. wire-bonding such that IC 2 can process the sensor signal.

FIGS. 5a and 5b show an electronic component 12 that extends over a part of through-hole 8. The electronic component 12 may even extend over all through-hole 8.

FIG. 6 shows the electronic component 12 may even cover the entire cross section of the through-hole 8. The electronic component 12 may even close through-hole 8. This embodiment provides a robust integration of an electronic component, like a sensor, at the through-hole of the package offering all sorts of interaction with and exposure to e.g. a fluid.

It will also be obvious after the above description and drawings are included to illustrate some embodiments of the invention, and not to limit the scope of protection. Starting from this disclosure, many more embodiments will be evident to a skilled person which are within the scope of protection and the essence of this invention and which are obvious combinations of prior art techniques and the disclosure of this patent.

The invention claimed is:

1. A package for an integrated circuit (IC), said package (1) comprising:
   a housing (3) of a first material, having top and bottom horizontal major surfaces (4, 5) which are opposite and substantially parallel to each other;
   a lead frame (6) for carrying the IC (2), the lead frame (6) comprising contact terminals (7) for electrical communication with the IC (2), the contact terminals (7) partly extending beyond the housing (3);
   a through-hole (8) extending vertically through the two major surfaces (4, 5) forming a space within the housing (3) and between the top and bottom major surfaces (4, 5); and
   an electronic component (12) extending into the space of said through-hole (8), at least one of an upper and a lower surface of the electronic component (12) being completely within the space so that a portion of the space extends vertically between the at least one of the upper and lower surface of the electronic component and a corresponding one of the top and bottom major surfaces.

2. The package according to claim 1, wherein a longitudinal axis (9) of said through-hole (8) is substantially perpendicular to said major surfaces (4, 5).

3. The package according to claim 1, wherein said electronic component (12) comprises a sensor surface (13).

4. The package according to claim 1, wherein a first portion (14) of said electronic component (12) is encapsulated by said housing (3).

5. The package according to claim 4, wherein said first portion (14) of said electronic component (12) comprises electrical contact members (15) for electrical contact with the IC (2).

6. The package according to claim 1, further comprising a ring member (10) having an opening.

7. The package according to claim 6, wherein said ring member (10) is of a second material.

8. The package according to claim 7, wherein said first material and said second material are different.

9. The package according to claim 6, wherein said ring member (10) is a carrier for carrying an electronic component (12).

10. An assembly, comprising:
    a package (1) according to claim 1; and
    a carrier element (16),
    wherein the carrier element (16) comprises a second through-hole (17) coaxial with said through-hole (8) in the package (1).

11. A package encapsulating an integrated circuit (IC), said package (1) comprising:
    a housing (3) with a first outermost surface (4) and an opposite second outermost surface (5) encapsulating an IC (2);
    a lead frame (6) carrying the IC (2), the lead frame (6) comprising contact terminals (7) for electrical communication with the IC (2); and
    a through-hole (8) penetrating through the housing (3) from a first opening in the first outermost surface (4) through to the a second opening in the second outermost surface (5), the through-hole (8) forming a through-hole space within the housing (3) between the outermost surfaces (4, 5), at least one of the first and second openings being beveled to form a chamfer at a junction where the at least one of the first and second openings meets the first and/or second outermost surface.

12. The package according to claim 11, further comprising:
    an electronic component (12) comprised of a cantilevered portion with a sensor surface extending into the through-hole space from a portion of the housing (3), the cantilevered portion positioned so that, in use, the sensor surface is exposed to a fluid within the through-hole space to measure one or more features of the fluid.

13. The package according to claim 11, further comprising:
    an electronic component (12) comprised of a protected portion, and a cantilevered portion with an exposed surface in connection with the protected portion, the protected portion encapsulated by a portion of the housing (3) and the exposed surface extending from the protected portion into the through-hole space from the portion of the housing (3).

14. The package according to claim 11, further comprising:
    a ring member (10) having an opening (11), the ring member being entirely within the through-hole (8) and in connection with the lead frame (6).

15. The package according to claim 14, wherein the opening (11) of the ring member (10) is congruent with the through-hole (8).

16. The package according to claim 14, further comprising:
    an electronic component (12) comprised of a connecting portion, and a cantilevered portion with an exposed surface extending from the connecting portion into the through-hole space, the connecting portion of the electronic component (12) being attached to the ring member (10), the housing (3), and the lead frame (6).

17. The package according to claim 16, wherein the connecting portion is encapsulated by a portion of the housing (3).

18. The package according to claim 16, wherein the exposed surface of the cantilevered portion is positioned to be exposed to a fluid within the through-hole space, the exposed surface being configured to measure one or more features of the fluid.

19. An assembly, comprising:
    a package (1) according to claim 11; and
    a carrier element (16),
    wherein the carrier element (16) comprises a second through-hole (17) coaxial with said through-hole (8) in the package (1).

* * * * *